(12) United States Patent
Dell et al.

(10) Patent No.: US 7,721,178 B2
(45) Date of Patent: *May 18, 2010

(54) SYSTEMS, METHODS, AND COMPUTER PROGRAM PRODUCTS FOR PROVIDING A TWO-BIT SYMBOL BUS ERROR CORRECTING CODE

(75) Inventors: Timothy J. Dell, Colchester, VT (US); Patrick J. Meaney, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 944 days.

This patent is subject to a terminal disclaimer.

(21) Appl. No.: 11/421,534

(22) Filed: Jun. 1, 2006

(65) Prior Publication Data

US 2007/0283229 A1    Dec. 6, 2007

(51) Int. Cl.
   *H03M 13/29*    (2006.01)
(52) U.S. Cl. .......................... 714/752; 714/755; 714/777
(58) Field of Classification Search ................ 714/752, 714/755, 777
See application file for complete search history.

(56) References Cited

U.S. PATENT DOCUMENTS

| | | | | |
|---|---|---|---|---|
| 3,622,984 | A | * | 11/1971 | Eastman ..................... 714/762 |
| 3,745,525 | A | * | 7/1973 | Hong et al. ................. 714/765 |
| 3,745,526 | A | * | 7/1973 | Hong et al. ................. 714/777 |
| 3,836,957 | A | | 9/1974 | Duke et al. |
| 4,005,405 | A | | 1/1977 | West |
| 4,413,339 | A | | 11/1983 | Riggle et al. |
| 4,464,753 | A | | 8/1984 | Chen |
| 4,589,112 | A | | 5/1986 | Karim |
| 4,617,664 | A | * | 10/1986 | Aichelmann et al. ........ 714/758 |
| 4,862,463 | A | | 8/1989 | Chen |
| 4,882,733 | A | * | 11/1989 | Tanner ........................ 714/752 |
| 4,961,193 | A | * | 10/1990 | Debord et al. .............. 714/753 |
| 5,001,712 | A | | 3/1991 | Splett et al. |
| 5,033,047 | A | | 7/1991 | Uehara |
| 5,068,858 | A | * | 11/1991 | Blaum et al. ................ 714/774 |
| 5,077,736 | A | * | 12/1991 | Dunphy et al. ................ 714/7 |
| 5,224,106 | A | | 6/1993 | Weng |
| 5,241,546 | A | | 8/1993 | Peterson et al. |

(Continued)

FOREIGN PATENT DOCUMENTS

JP      04165425 A      11/1992

OTHER PUBLICATIONS

Hassner, M. et al., "Integrated Interleaving— A Novel ECC Architecture" IEEE Transactions on Magnetics, vol. 37, No. 2, Mar. 2001, pp. 773-775.*

(Continued)

*Primary Examiner*—Stephen M Baker
(74) *Attorney, Agent, or Firm*—Cantor Colburn LLP; John Campbell

(57) ABSTRACT

Systems, methods and computer program products for providing a nested two-bit symbol bus error correcting code. Methods include constructing a nested error correcting code (ECC) scheme. The method includes receiving a Hamming distance n code. A symbol correcting code H-matrix is created by iteratively adding rows of H-matrix bits on a symbol column basis such that the symbol correcting code H-matrix describes a symbol correcting code, and the Hamming distance n code is preserved as a subset of the symbol correcting code H-matrix.

19 Claims, 7 Drawing Sheets

U.S. PATENT DOCUMENTS

| | | | |
|---|---|---|---|
| 5,369,641 A * | 11/1994 | Dodt et al. | 714/702 |
| 5,450,423 A | 9/1995 | Iwasaki et al. | |
| 5,487,077 A | 1/1996 | Hassner et al. | |
| 5,490,155 A | 2/1996 | Abdoo et al. | |
| 5,535,354 A | 7/1996 | Reiff | |
| 5,539,755 A * | 7/1996 | Baggen | 714/779 |
| 5,548,532 A | 8/1996 | Menand et al. | |
| 5,563,894 A | 10/1996 | Fugiwara et al. | |
| 5,703,886 A | 12/1997 | Lee et al. | |
| 5,727,003 A | 3/1998 | Zook | |
| 5,740,186 A * | 4/1998 | Widmer | 714/753 |
| 5,740,188 A * | 4/1998 | Olarig | 714/763 |
| 5,751,744 A * | 5/1998 | Babb | 714/800 |
| 5,781,568 A | 7/1998 | Hsieh | |
| 5,841,795 A * | 11/1998 | Olarig et al. | 714/768 |
| 5,856,987 A | 1/1999 | Holman | |
| 5,881,071 A * | 3/1999 | Kuznetsov et al. | 714/752 |
| 5,922,080 A | 7/1999 | Olarig | |
| 6,024,486 A * | 2/2000 | Olarig et al. | 714/763 |
| 6,041,430 A | 3/2000 | Yamauchi | |
| 6,052,818 A | 4/2000 | Dell et al. | |
| 6,061,824 A | 5/2000 | Mo et al. | |
| 6,105,155 A | 8/2000 | Cheng et al. | |
| 6,128,758 A | 10/2000 | Hall et al. | |
| 6,247,169 B1 | 6/2001 | DeLong | |
| 6,463,563 B1 * | 10/2002 | Chen et al. | 714/768 |
| 6,543,029 B1 | 4/2003 | Sandorfi | |
| 6,675,341 B1 | 1/2004 | Chen et al. | |
| 6,675,349 B1 | 1/2004 | Chen | |
| 6,732,291 B1 * | 5/2004 | Kilmer et al. | 714/7 |
| 6,751,789 B1 | 7/2004 | Berry et al. | |
| 6,938,193 B1 | 8/2005 | Honda | |
| 6,971,049 B2 | 11/2005 | Bakke et al. | |
| 7,103,818 B2 * | 9/2006 | Yedidia et al. | 714/752 |
| 7,103,829 B2 * | 9/2006 | Van Dijk et al. | 714/777 |
| 7,296,212 B1 * | 11/2007 | Hammons, Jr. | 714/781 |
| 7,370,264 B2 * | 5/2008 | Worley et al. | 714/781 |
| 7,389,465 B2 * | 6/2008 | Radke et al. | 714/755 |
| 7,331,010 B2 | 12/2008 | Dell et al. | |
| 7,484,165 B2 * | 1/2009 | Griesser et al. | 714/782 |

OTHER PUBLICATIONS

Xia, H. et al., "Nested Codes for Perpendicular Recording Channels", IEEE Transactions on Magnetics, vol. 40, No. 4, Jul. 2004, pp. 3111-3113.*

Timothy J. Dell, USPTO Office Action for U.S. Appl. No. 11/421,532, filed Mar. 12, 2009, pp. 12.

Timothy J. Dell, USPTO Office Action for U.S. Appl. No. 11/421,538, filed Mar. 12, 2009, pp. 11.

Timothy J. Dell, USPTO Office Action for U.S. Appl. No. 11/421,537, filed Mar. 12, 2009, pp. 11.

* cited by examiner

FIG. 3
(PRIOR ART)

```
            0000000000111111111122222222223333333333444444444455555555556666666677
            0123456789012345678901234567890123456789012345678901234567890123456789  5-WEIGHT 1-WEIGHT
01000100010010000101100010101011100100010000000110011  00111110  10000000  27
00001010001011001100001010000010100000011011110000101101  01110101  01000000  27
00100011001100100000000100001001011111100001010111  11001110  00100000  27
00100100110111110100000100010011011101010010100000010  11001011  00010000  27
10000100001000010000001000010111110110000010111000100  11001011  00001000  27
11011011110101000110001110001100011100001011100000001  10011011  00000100  27
01011100010000110010100011110111011111000000101001010000  01111100  00000010  27
10111000100010001010111111110000001100000011010001010000  10110101  00000001  27
                                                    11100011
                                  3-WEIGHT          5-WEIGHT  1-WEIGHT
```

FIG. 3
(PRIOR ART)

SYSTEMS, METHODS, AND COMPUTER PROGRAM PRODUCTS FOR PROVIDING A TWO-BIT SYMBOL BUS ERROR CORRECTING CODE

CROSS-REFERENCE TO RELATED APPLICATIONS

This application contains subject matter that is related to the subject matter of the following co-pending applications filed contemporaneously with the present application, each of which is assigned to the same assignee as this application, International Business Machines Corporation of Armonik, N.Y. Each of the below listed applications is hereby incorporated herein by reference in its entirety:

United State Patent Application, entitled: SYSTEMS, METHODS AND COMPUTER PROGRAM PRODUCTS FOR PROVIDING A TWO-BIT SYMBOL BUS ERROR CORRECTING CODE WITH BUS TIMING IMPROVEMENTS, U.S. patent application Ser. No. 11/421,532;

United States Patent Application, entitled: SYSTEMS, METHODS AND COMPUTER PROGRAM PRODUCTS FOR PROVIDING A TWO-BIT SYMBOL BUS ERROR CORRECTING CODE WITH BUS DIAGNOSTIC FEATURES, U.S. patent application Ser. No. 11/421,537; and United States Patent Application, entitled: SYSTEMS, METHODS AND COMPUTER PROGRAM PRODUCTS FOR PROVIDING A TWO-BIT SYMBOL BUS ERROR CORRECTING CODE WITH ALL CHECKBITS TRANSFERRED LAST, U.S. patent application Ser. No. 11/421,538.

BACKGROUND OF THE INVENTION

This invention relates to transferring data across computer, communications, or storage device buses, and particularly to protecting the data by means of a nested error correcting code (ECC) scheme.

In the past, it was very common for computer systems to use wide parallel buses with many bits or bitlanes in a parallel configuration. These buses would deliver a dataword from a source to a receiver in one transfer. Thus, for example, a commonly used bus would deliver 64 databits to its destination every transfer cycle. Such a bus could be found both on-chip, on-module, and on-board. Also in the past, it was very common for communications systems to use a narrow, single wire bus with only one bitlane used per bus. These buses would deliver their dataword from a single source to a single (or multiple) receivers over many transfer cycles, i.e., one bit after another would be sent down the bitlane until the entire payload or dataword was delivered.

In order to insure that the data arrives safely at the receiver, some kind of error checking or correcting on the bus may be employed. In high-reliability computers, the parallel buses are typically protected with an ECC. In high-reliability communications links, cyclical redundancy checking (CRC) is often employed. Generally speaking, ECC is usually used to provide "real-time" correction of a bad databit(s), and CRC is usually used to provide "real-time" detection of a bad databit(s). In the ECC scheme, the data is manipulated by the logic of the ECC to adjust the data received by the receiver such that "good" data will be passed along downstream. In the CRC scheme, the data source is required to resend the bad dataword when signaled by the CRC that bad data was received. In such systems, ECC tends to be more effective when the nature of the errors is permanent (e.g., hard errors), and CRC tends to be more effective when the nature of the errors is transient (e.g., soft errors).

In future electronic systems, the traditional boundaries between computers and communication systems is blurring. Data is often transferred along a parallel, high-speed bus over several transfer cycles. This scheme provides very high bandwidth, but it also makes it necessary to deal with both hard and soft errors. Hard errors occur when the physical medium experiences a fault, such as a burned-out driver. Soft errors occur when noise, skew and jitter flip a bit along a single bitlane. It would be desirable to have a fault-tolerant high-speed parallel bus that is resilient to both hard and soft errors.

The industry is moving in the direction of using CRC across the multiple bitlanes of a high-speed, parallel bus that signals for a retry whenever an error is present. These schemes have strong error detection, which is effective for soft errors, they but cannot correct an error, which makes them less useful for hard errors. In systems where hard error protection is necessary, an extension to the CRC has been proposed which includes a spare bitlane in the bus such that when a hard error is encountered, the bus will re-configure itself to replace the failing bitlane with the presumably-good spare bitlane. Another alternative to provide protection for both hard and soft errors is a symbol-protecting bus ECC structure, where the symbols are defined along the bitlanes, rather than the traditional, across-word structure. This has been described in United States Patent Publication No. US20060107175A1, of common assignment herewith, filed Oct. 29, 2004, entitled: "System, Method and Storage Medium for Providing Fault Detection and Correction in a Memory Subsystem."

Finally, while the previously disclosed base structure provides advantages over the CRC/spare approach, it is not always an obvious or non-trivial task to create an ECC that meets the needs of the system. One such need that is becoming more and more frequent is the case where one ECC word is sent across a bus using a second, different, nested ECC scheme for protection on the bus. For example, data stored in memory may best be served by a Single Error Correcting (SEC) and Double Error Detecting (DED) code, often shortened to "SEC/DED." However, if this ECC word is sent across a high-speed parallel bus in two transfers, a different code is required to protect against bitlane failures. Thus for the bus transfer, a single 2-bit-symbol error correcting and double 2-bit-symbol error detecting (S2EC/D2ED) code is appropriate, where the symbols are aligned along the bitlanes. However, the construction of such a nested code is neither obvious nor non-trivial, especially for the 2-bit-symbol case. It would be desirable to have a scheme to generate such nested, 2-bit-symbol codes, which maintain and/or reuse part of the original SEC/DED code.

BRIEF SUMMARY OF THE INVENTION

Embodiments include a method of constructing a nested error correcting code (ECC) scheme. The method includes receiving a Hamming distance n code. A symbol correcting code H-matrix is created by iteratively adding rows of H-matrix bits on a symbol column basis such that the symbol correcting code H-matrix describes a symbol correcting code, and the Hamming distance n code is preserved as a subset of the symbol correcting code H-matrix.

Embodiments also include a computer program product for constructing a nested ECC scheme. The computer program product includes a storage medium readable by a processing circuit and storing instructions for execution by the processing circuit for facilitating a method. The method includes receiving a Hamming distance n code. A symbol correcting code H-matrix is created by iteratively adding rows of H-matrix bits on a symbol column basis such that the symbol correcting code H-matrix describes a symbol correcting code, and the Hamming distance n code is preserved as a subset of the symbol correcting code H-matrix.

Further embodiments include a computer or communications or storage system with a nested ECC scheme. The system includes a first code to provide error correcting capabilities. The first code includes checkbits and databits. The system also includes a second, different code to provide different error correcting capabilities. The second code includes additional checkbits and databits. The second code has the first code nested as a subset of the second code.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES:

FIG. 3 shows a basic single error correcting and double error detecting Hamming distance code n matrix;

DETAILED DESCRIPTION OF EXEMPLARY EMBODIMENTS

Exemplary embodiments provide methods and apparatuses for generating a bus error correcting code (ECC) for an m-transfer class of buses, where m is greater than 1 (i.e., the dataword is transferred over two or more bus cycles, with some or all of a different ECC codeword being incorporated into the bus ECC codeword).

Exemplary embodiments include a method of constructing a nested error correcting code (ECC) scheme. The method includes receiving a Hamming distance n code. A symbol correcting code H-matrix is created by iteratively adding rows of H-matrix bits on a symbol column basis such that the symbol correcting code H-matrix describes a symbol correcting code, and the Hamming distance n code is preserved as a subset of the symbol correcting code H-matrix.

As is commonly known in the art, the term "Hamming distance" refers to how powerfully an ECC can detect and/or correct errors. A d=3 code can correct all single errors. A d=4 code can correct all single errors while simultaneously detecting all double errors. A d=5 code can correct all double errors. A d=6 code can correct all double errors while simultaneously detecting all triple errors. The concept is further understood to be applicable to symbol-oriented codes, where a symbol is a predefined group of bits in the code stream. Thus a distance 4 symbol code can correct all single symbol errors while simultaneously detecting all double symbol errors, etc. In general, the terms Single Symbol Correcting (SSC) and Double Symbol Detecting (DSD) would be combined for a distance 4 code and it would be designated, SSC/DSD, and similarly for a distance 4 binary code, the terms Single Error Correcting (SEC) and Double Error Detecting (DED) would be combined and thus the code would be referred to as a SEC/DED code.

Figure 1:
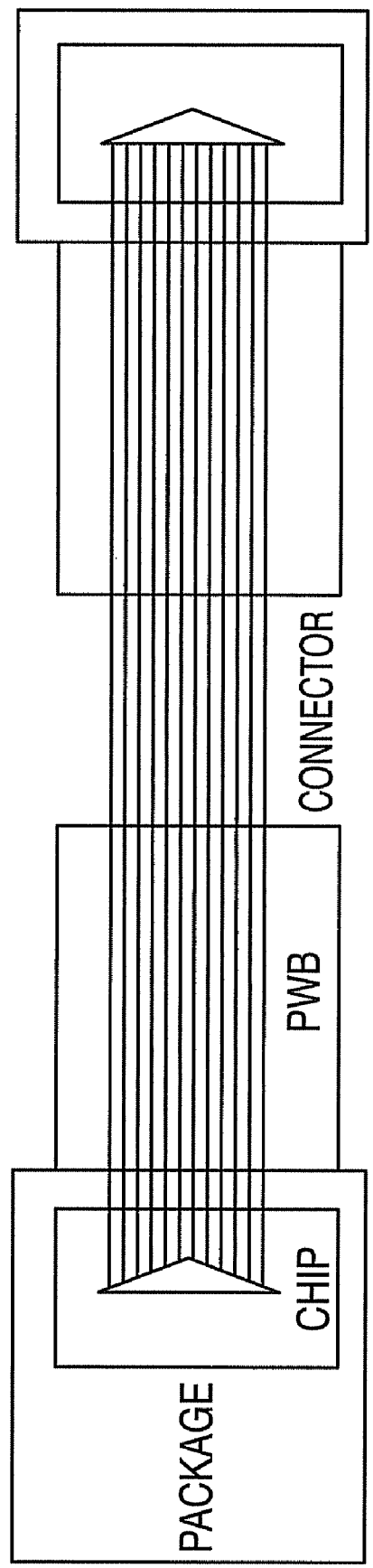
FIG. 1 is an exemplary standard, parallel bus, showing the bus bitlanes in pictoral format.
Figure 2:
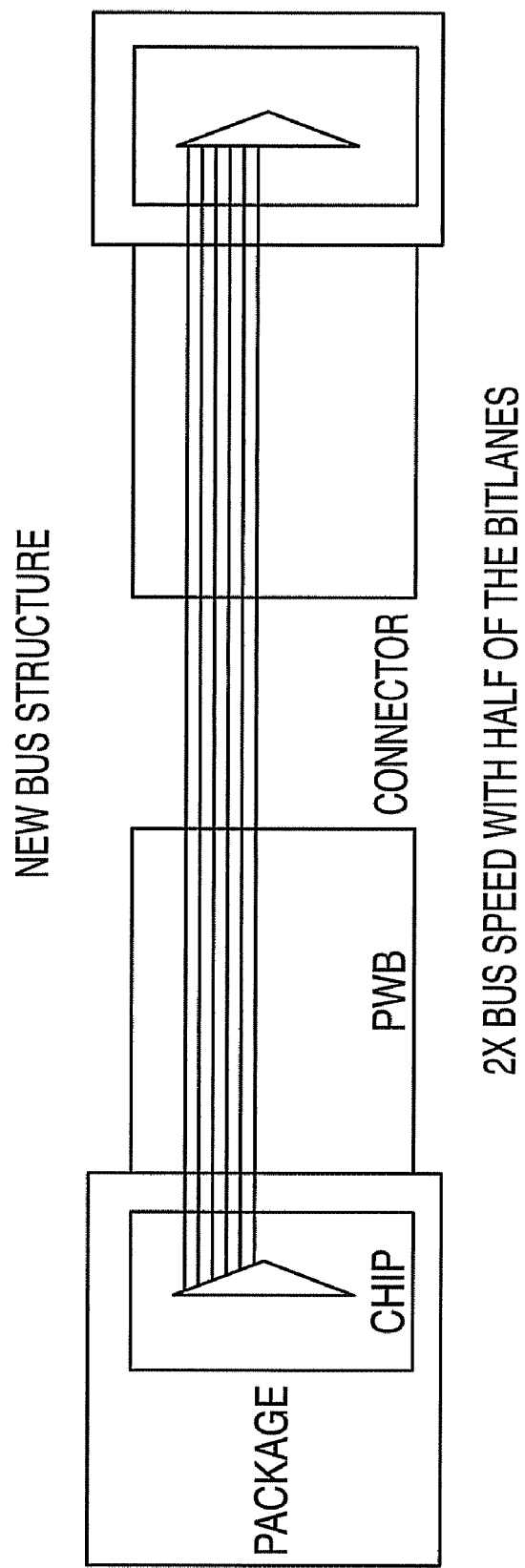
FIG. 2 is a representation of a high-speed bus where the number of bitlanes are reduced, but the speed of the data transfers is increased to provide for equivalent or faster bus bandwidth.

FIG. 1 depicts an exemplary basic parallel bus structure. The bus includes twelve wires with each wire transmitting data, control information, and/or ECC checkbits depending on the data transfer format and protocol. In addition, one of the wires may be reserved to be utilized as a spare wire in the event that one of the other wires fails. The exemplary bus depicted in FIG. 1 is a one-way bus that originates on a printed wiring board (PWB) and is in communication with another PWB. FIG. 2 depicts an exemplary high speed parallel bus structure with six wires each transmitting data, control information, and/or ECC checkbits depending on the data transfer format and protocol. In addition, one of the wires may be reserved as a spare wire in the event that one of the other wires fails. As compared to the bus depicted in FIG. 1, the bus In FIG. 2 has a reduced number of bitlanes (thus, what was done in a single transfer in FIG. 1 is now done in two or more transfers), with the speed of the data transfers typically increased to provide for equivalent or faster bus bandwidth. FIG. 1 and FIG. 2 show twelve and six wires, respectively and are intended to be examples of buses that may be utilized by exemplary embodiments. Buses of any number of wires (including unidirectional and bidirectional buses) may be utilized by exemplary embodiments.

FIG. 3 shows a basic SEC/DED code H-matrix. One of the simplest single error detecting (SED) codes is a parity code. In terms of "exclusive ORs" (XOR's), the parity bit is the XOR or "exclusive not OR" (XNOR) of all of the databits (depending on whether the scheme calls for "even" or "odd" parity). A Hamming code is a single error correcting (SEC) code that is more complex and powerful than a parity code. For example, if a dataword that is parity protected at one point in a computer or communications system is then required to be further encoded to provide SEC/DED protection, a simple code construction exists to allow reuse of the parity code as a nested code within an extended Hamming code. In exemplary embodiments, the construction is to take an existing Hamming code and add an overall parity checkbit to provide a SEC/DED extended Hamming code, which has the parity code nested within it and which has the parity bit reused as one of the Hamming code checkbits. Since ECCs (e.g., SEC/DED codes) are often described in terms of H-matrices (arrays of ones and zeros that indicate which databits have to be XOR'd together to encode checkbits), a simple example of the parity code nested within an SEC/DED code is described below.

The parity code of 4 databits: P1=D1*D2*D3*D4, where the * symbol indicates a Boolean exclusive OR function, is a degenerate H-matrix of 1 1 1 1. A Hamming code of 4 databits can be represented as:

1 0 1 1 1 0 0

1 1 0 1 0 1 0

0 1 1 1 0 0 1

This means that checkbit 1 (C1)=D1*D3*D4, and checkbit 2 (C2)=D1*D2*D4, and checkbit 3 (C3)=D2*D3*D4.

This SEC Hamming code, which is defined as a distance three code (or d=3), can be extended to an SEC/DED extended Hamming code (d=4) by adding one checkbit to the H-matrix as follows:

1 0 1 1 1 0 0 0
1 1 0 1 0 1 0 0
0 1 1 1 0 0 1 0
1 1 1 1 0 0 0 1

This means that C1, C2, and C3 remain the same, and a new checkbit, checkbit 4 (C4), is added and C4=D1*D2*D3*D4.

Now, it is readily seen that C4 is exactly the same as P1. This means that if data is stored with parity, and it is desired to provide SEC/DED protection for its transference over a bus, for example, the parity code can be reused or nested within the extended Hamming code by using the construction shown. However, once one moves beyond parity and Hamming codes, there are no known mathematical constructions that will guarantee code nesting.

A common computer cache memory is one that contains 64-bit datawords that are protected in memory by eight checkbits, thus forming 72-bit ECC words. After the ECC word is taken out of memory, it can be transferred to another unit across a high-speed, 2-transfer data bus. The decision to use a two-transfer bus is made based on overall system architectures and timings, and seems to be a popular choice, although by no means an exclusive choice. If the 72-bit ECC word were just split in two, sent across a 36-bit high-speed bus, and reconstructed on the other side, the system would still be able to correct all single bit errors and detect all double bit errors. However, if a single driver on the bus were to fail, or a single bitlane (e.g., wire) on the bus were to be corrupted, then the system would experience an uncorrectable error. To avoid this, the 72-bit ECC word may be nested within a 76-bit ECC word, which only adds two wires to the bus and allows two-bit-symbol correction to be performed.

Since one of the objects of exemplary embodiments described herein is to save logic circuits and logic delay, exemplary embodiments start with a minimal extended Hamming code. This can be constructed by choosing only odd-weighted columns to be in the SEC/DED extended Hamming code H-matrix. Such a code is called a Hsiao code, and to make it minimal, first the one-weight columns are chosen for the checkbits, then the three-weight columns until they are exhausted, and then the five-weight columns, and then the seven-weight columns. By using only the odd weights and by starting with the smaller weights, exemplary embodiments are achievable to obtain a minimal weight SEC/DED code. Furthermore, it is important to balance the row weights of the H-matrix, as this also affects the logic design and timing, and so a little trial and error can be used on the last couple of higher-order column-weight columns so that each row in the H-matrix is balanced. Thus, a balanced, minimal SEC/DED H-matrix is shown in FIG. 3, with the column weights and row weights highlighted beneath and to the right of the matrix, respectively, and the databit column numbers (0-63) across the top. The checkbits are in columns 64-71. The SEC/DED and S2EC/D2ED codes include both databits and checkbits.

It should be noted that for SEC/DED codes, rows can be transposed and/or XOR'd with other rows, and columns can be swapped, without any loss of code efficiency. FIG. 3 describes an SEC/DED code (in the format of an H-matrix) in logical terms, a designer can utilized any actual hardware and/or software configuration as long as it obtains the same results as those depicted in FIG. 3.

In exemplary embodiments, a two-bit-symbol correcting code (example referred to herein is a S2EC/D2ED H-matrix) is constructed that uses the matrix depicted in FIG. 3 (referred to herein as a H-matrix with a nested SEC/DED code) for its nested component. According to standard two-bit-symbol code constructions, a total of twelve checkbits are needed to protect 64 databits. Thus, each column of the H-matrix needs to have four more entries added to it such that there are twelve checkbits described for providing S2EC/D2ED protection for the dataword as it is transferred across a two-cycle high-speed bus on thirty-eight total bitlanes.

Figure 4A:
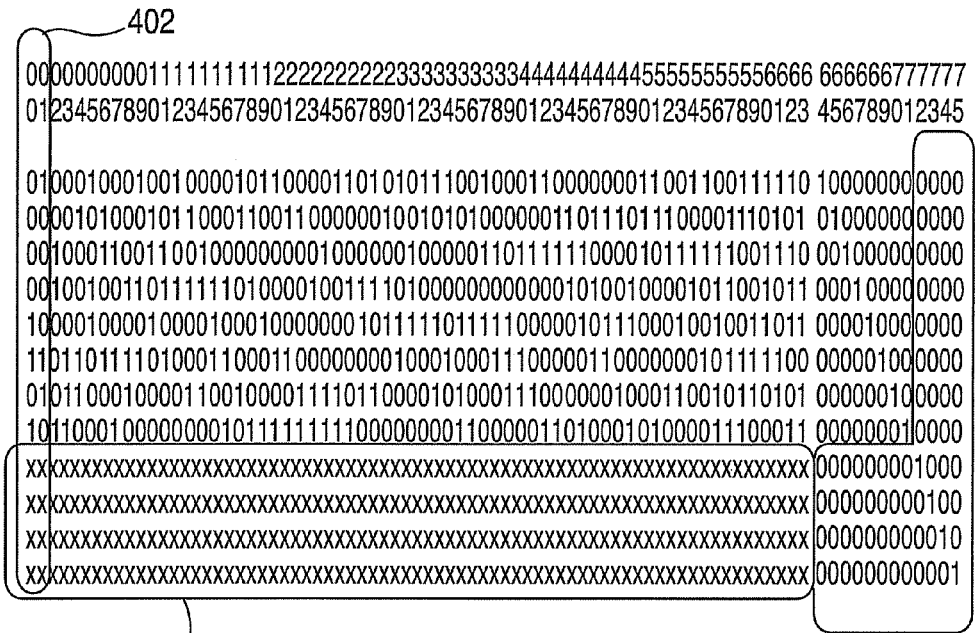
FIG. 4 shows the framework of a nested code stored in a H-matrix that may be implemented by exemplary embodiments.
Figure 4B:
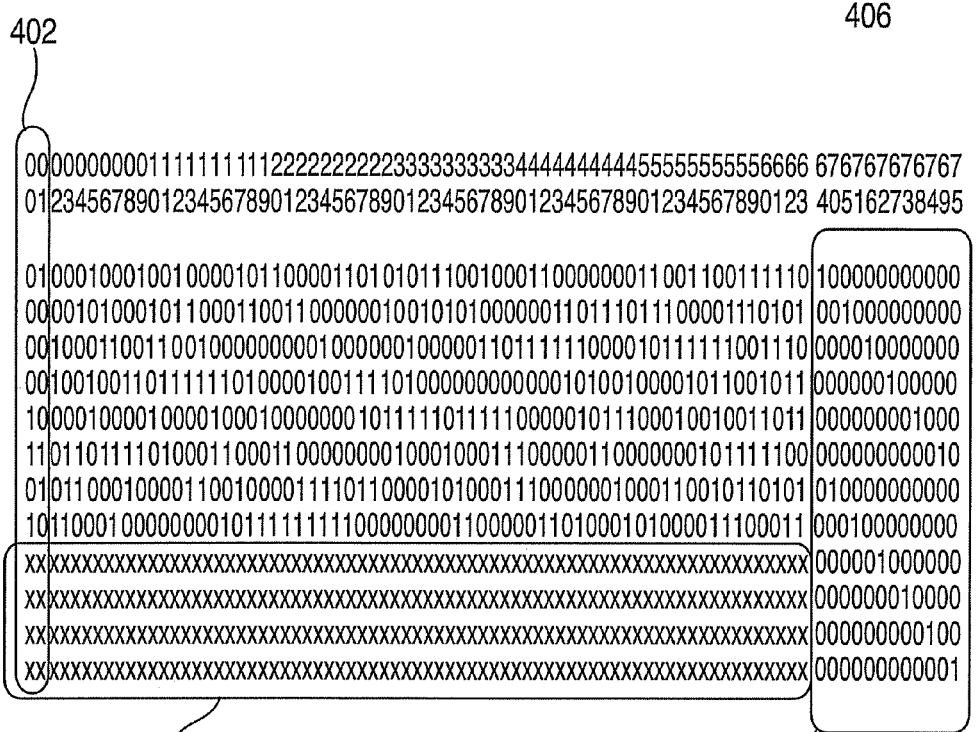

FIG. 4 shows the framework of a S2EC/D2ED H-matrix according to the exemplary embodiments. In exemplary embodiments, the S2EC/D2ED H-matrix skeleton would looks like the matrix depicted in FIG. 4, where the "x's" indicate the new H-matrix bits to be determined (referred to herein as the extension bits 404), the "1's" and "0's" represent the additional checkbits 406 that have been added, and the bold "1's," "0's," and "x's" indicate the first symbol column 402.

Figure 5:
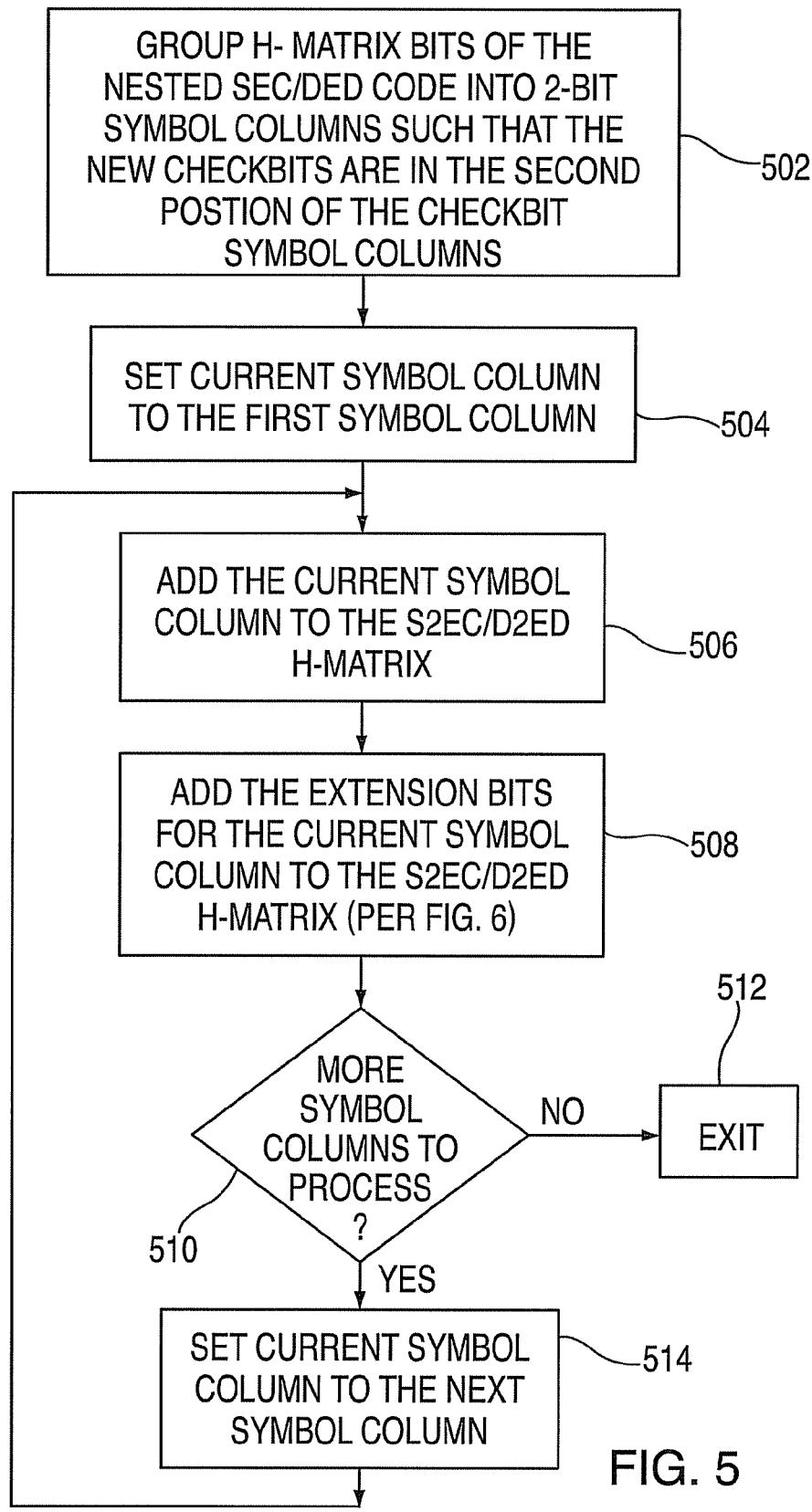
FIG. 5 depicts a process flow that may be utilized by exemplary embodiments to create a nested two-bit symbol bus error correcting code.
Figure 6:
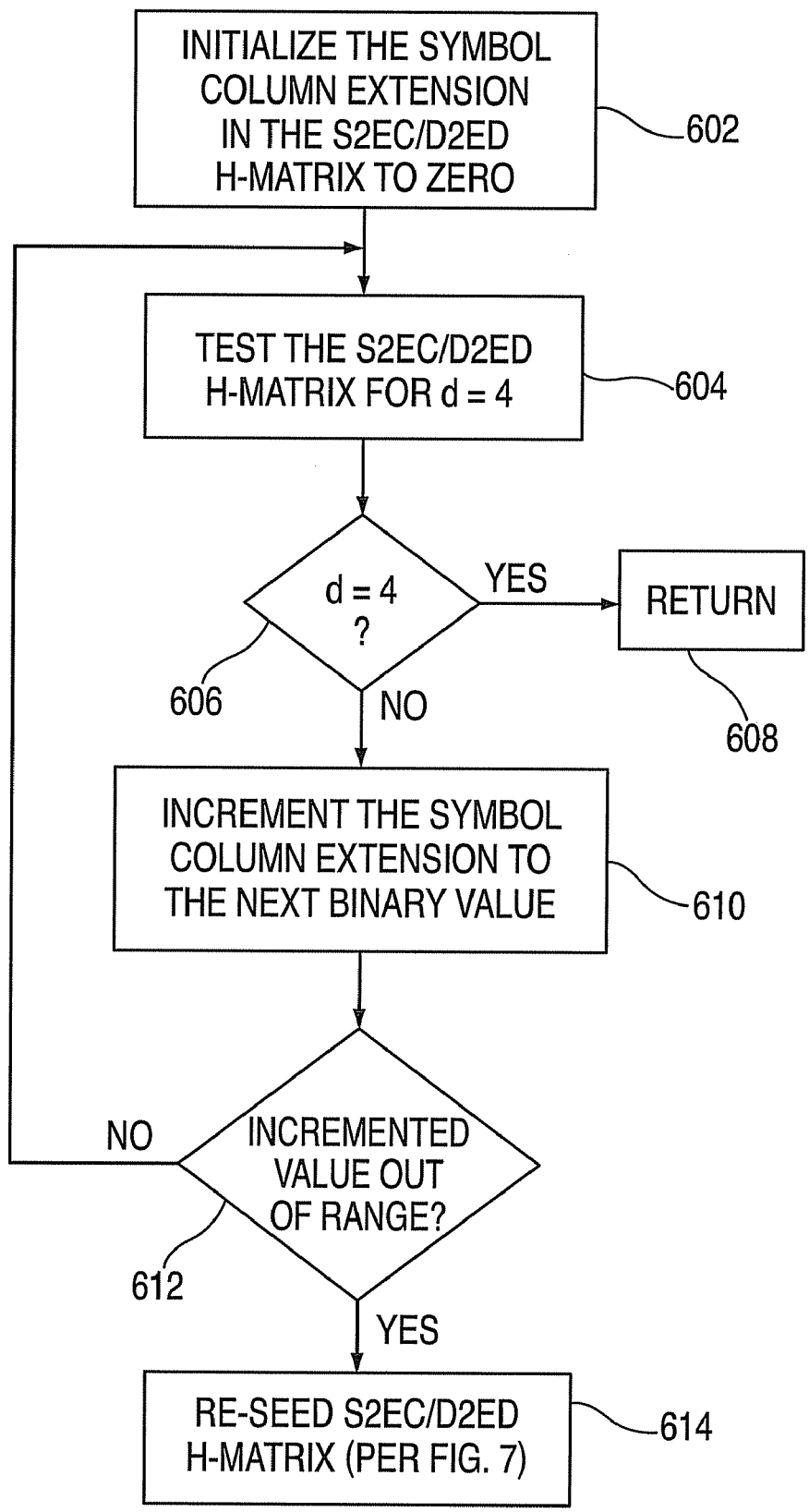
FIG. 6 depicts a process flow that may be utilized by exemplary embodiments to add extension bits to a symbol column.
Figure 7:
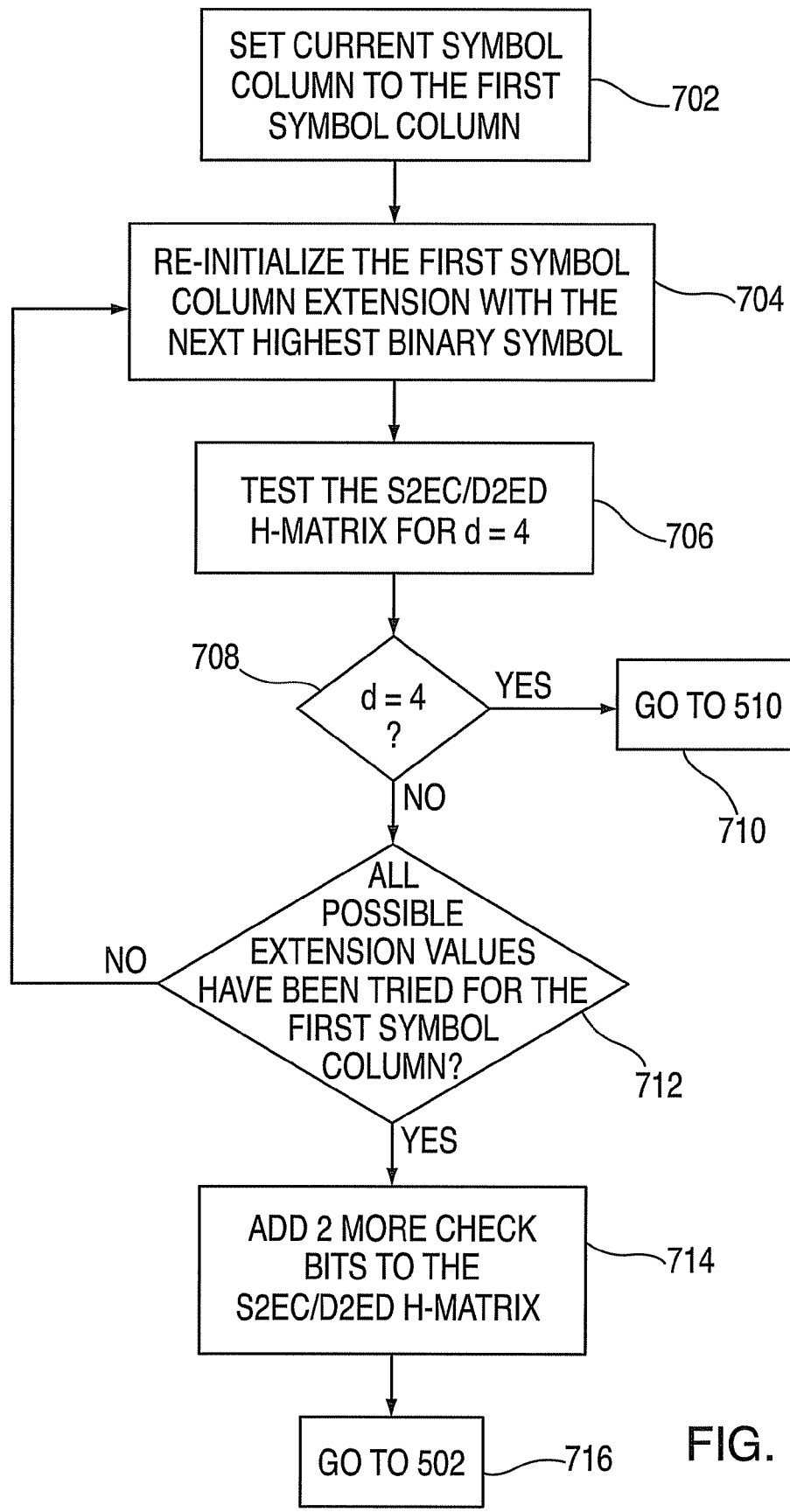
FIG. 7 depicts a process flow that may be utilized by exemplary embodiments to re-seed the nested two-bit symbol bus error correcting code.

FIGS. 5-7 depict process flows that may be utilized by exemplary embodiments to create a S2EC/D2ED H-matrix (an exemplary symbol correcting code) according to exemplary embodiments. FIG. 5 depicts an overall process flow that may be utilized to fill in a S2EC/D2ED H-matrix such as the one depicted in FIG. 4 in order to construct a S2EC/D2ED code. The process depicted in FIG. 5 iteratively adds rows to the S2EC/D2ED H-matrix on a symbol column basis. At block 502, the H-matrix bits of the nested SEC/DED code are grouped into two-bit symbol columns (00, 01, 02, 03, 04, 05, etc.). At block 504, the current symbol column is set to symbol column 00, the first symbol column 402. At block 506, the current symbol column is added to the S2EC/D2ED matrix and at block 508, the values of the extension bits for the current symbol column are determined and added to the S2EC/D2ED H matrix. In exemplary embodiments, the values of the extension bits for the current symbol column are determined by a process such as that described below in reference to FIG. 6.

It is determined if there are more symbol columns left to be processed at block 510. If all of the symbol columns have been processed, then the S2EC/D2ED H-matrix has been completed and the process is exited at block 512. As described herein, the processing is exited at block 512 when a true S2EC/D2ED code to correct all single two-bit errors and to detect all double two-bit error has been created in the S2EC/D2ED H-matrix. If there are more symbol columns left to be processed, as determined at block 512, then block 514 is performed. At block 514, the current symbol column is set to the next symbol column and iterative processing of each symbol column continues at block 506.

FIG. 6 depicts an exemplary process for adding the extension bits for the current symbol column to the S2EC/D2ED H matrix as performed by block 508 in FIG. 5. The process depicted in FIG. 6 begins at block 602 when the symbol column extension in the S2EC/D2ED H-matrix for the current symbol column is initialized to zero. At block 604, the S2EC/D2ED H matrix is tested for d=4 using any method known in the art, such as the MacWilliams identity or by an exhaustive, trial and error method. If the Hamming distance, "d", has a value of 4 or greater, then a SEC/DED code is generally assured. If d=4, as determined at block 606, the block 608 is performed and processing resumes at block 510 in FIG. 5. If "d" does not equal 4, as determined at block 606 in FIG. 6, then processing continues at block 610. Other values of "d" may be tested for, for example "d" may be set to five to test for a symbol correcting code that may be utilized for double error correction.

At block 610, the symbol column extension for the current symbol column is incremented to the next binary value. At block 612, it is determined if the incremented value is out of range (implying that all possible combinations have been tried). If all possible combinations have been tried, then processing continues at block 614, where the process described herein in reference to FIG. 7 is invoked to re-seed the S2EC/D2ED H-matrix. If all possible combinations have not been tried, then processing continues at block 606, where the S2EC/D2ED H-matrix is tested for d=4.

FIG. 7 depicts a process that may be implemented by exemplary embodiments to re-seed the S2EC/D2ED H-matrix. In exemplary embodiments, the processing depicted in FIG. 7 is invoked by block 614 when all possible combinations for the symbol column extension bits for the current column have been tried and "d" does not equal 4 then a S2EC/D2ED code has not been achieved. Therefore, at block 702, the current symbol column is set to the first symbol column and at block 704, the first symbol column is re-initialized with the next higher binary symbol column extension (e.g., if previously started with zero-zero, then move to one-zero). At block 706, the S2EC/D2ED H-matrix is tested for d=4 using, for example, the MacWilliams identity or an exhaustive, trial and error method. If d=4, as determined at block 708, then processing continues at block 710. At block 710, the process continues at block 510 in FIG. 5 to continue processing the rest of the symbol columns in the S2EC/D2ED H-matrix starting over with the second symbol column.

If "d" does not equal 4, as determined at block 708, then block 712 is performed to determine if all possible extension values have been tried for the first symbol column. If all possible extension values have not been tried, then processing continues at block 704 to try the next highest binary symbol. If all possible extension values have been tried, as determined at block 712, the processing continues at block 714. At block 714, two more checkbits (i.e., two more rows and two more columns) are added to the S2EC/D2ED H-matrix. After the two additional checkbits are added, the whole process is repeated beginning at step 502 in FIG. 5.

The examples described herein relate to two-bit error codes. It is within the scope of exemplary embodiments to expand this to three or more bit error codes. The same iterative processing described herein may be utilized to create three bit error codes.

The examples described herein relate to a SEC/DED H-matrix that has eight rows and 72 columns and a S2EC/D2ED H-matrix that has twelve rows and 76 columns. These H-matrices are examples only as the size of the H-matrices will vary based on the number of wires on the bus and the type of error detecting and correcting being performed.

The examples described herein relate to a S2EC/D2ED two bit symbol correcting code. As will be evident to those skilled in the art, other symbol correcting codes, such as a four bit S4EC/D4ED and an eight bit S8EC/D8ED, may be created using the processing described herein.

The examples described herein relate to a Hamming distance of four. As will be evident to those skilled in the art, other Hamming distances can be supported using the processing described herein. For example, if only a SEC code is required, then "d" can be set to three.

The examples described herein relate to a SEC/DED code. As will be evident to those skilled in the art, other Hamming distance n codes may be utilized by exemplary embodiments.

For example, the Hamming distance n code may be a double error correction and triple error detection code.

The capabilities of the present invention can be implemented in software, firmware, hardware or some combination thereof.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

Technical effects and benefits of exemplary embodiments include a structured means of developing symbol correcting codes (e.g., a S2EC/D2ED code) with nested Hamming distance n codes (e.g., a SEC/DED code) that reuse all or part of the Hamming distance n code checkbits and databits as part of the symbol correcting code checkbits and databits. The ability to reuse the logic and circuitry may result in a significant savings in both logic and delay.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A computer implemented method of constructing a nested error correcting code (ECC) scheme, the method comprising:

receiving in a computer system a Hamming distance n code; and creating in the computer system a symbol correcting code H-matrix by iteratively adding rows of H-matrix bits on a symbol column basis such that the symbol correcting code H-matrix describes a symbol correcting code, and the Hamming distance n code is preserved as a subset of the symbol correcting code H-matrix.

2. The method of claim 1 wherein the Hamming distance n code is a single error correcting and double error detecting (SEC/DED) code.

3. The method of claim 1 wherein the symbol correcting code is a single two-bit symbol error correcting and double two-bit symbol error detecting (S2EC/D2ED) code.

4. The method of claim 1 wherein the creating includes verifying the symbol correcting code H-matrix using a MacWilliams identity.

5. The method of claim 1 wherein the creating includes verifying the symbol correcting code H-matrix using an exhaustive trial and error method.

6. The method of claim 1 wherein the Hamming distance n code is utilized for detecting and correcting memory errors.

7. The method of claim 1 wherein the symbol correcting code is utilized for detecting and correcting bus errors.

8. A computer program product for constructing a nested ECC scheme, the computer program product comprising:

a computer readable storage medium readable by a processing circuit and storing instructions for execution by the processing circuit for facilitating a method, the method including:

receiving a Hamming distance n code; and creating a symbol correcting code H-matrix by iteratively adding rows of H-matrix bits on a symbol column basis such that the symbol correcting code H-matrix describes a symbol correcting code, and the Hamming distance n code is preserved as a subset of the symbol correcting code H-matrix.

9. The computer program product of claim 8 wherein the Hamming distance n code is a SEC/DED code.

10. The computer program product of claim 8 wherein the symbol correcting code is a two-bit symbol error correcting code.

11. The computer program product of claim 8 wherein the symbol correcting code is a S2EC/D2ED code.

12. The computer program product of claim 8 wherein the symbol correcting code is a double two-bit symbol error detecting code.

13. The computer program product of claim 8 wherein the Hamming distance n code is formatted as a H-matrix that is a subset of the symbol correcting code H-matrix and the creating includes adding additional rows and columns to the Hamming distance n code H-matrix.

14. The computer program product of claim 8 wherein the creating verifying the symbol correcting code H-matrix using one or more of a MacWilliams identity and an exhaustive trial and error method.

15. A computer or communications or storage system with a nested ECC scheme, the system comprising:

a first code to provide error correcting capabilities, the first code including first code checkbits and first code datbits;

a second, different code to provide different error correcting capabilities, the second code including additional second code checkbits, said second code having said first code as a subset of said second code; and a circuit capable of sending the first code and the second code checkbits over a bus in two or more transfers, wherein the first code checkbits and the second code checkbits are both always applied to the first code datbits; and the circuit also capable of performing a method comprising receiving a Hamming distance n code and creating a symbol correcting code H-matrix by iteratively adding rows of H-matrix bits on a symbol column basis such that the symbol correcting code H-matrix describes a symbol correcting code, and the Hamming distance n code is preserved as a subset of the symbol correcting code H-matrix, wherein the Hamming distance n code is the first code and the symbol correcting code H-matrix is the second code.

16. The system of claim 15, wherein the Hamming distance n code is a SEC/DED code.

17. The system of claim 15, wherein the symbol correcting code is a S2EC/D2ED code.

18. The system of claim 15, wherein the Hamming distance n code is formatted as a H-matrix that is a subset of the symbol correcting code H-matrix and the creating includes adding additional rows and columns to the Hamming distance n code H-matrix.

19. The system of claim 15, wherein the Hamming distance n code is the first code, and the symbol correcting code is the second code.

* * * * *